United States Patent
Chen

(10) Patent No.: US 10,374,161 B2
(45) Date of Patent: Aug. 6, 2019

(54) GLASS SUBSTRATE SEPARATION METHOD AND GLASS SUBSTRATE SEPARATION DEVICE

(71) Applicant: Wuhan China Star Optoelectronics Semiconductor Display Technology Co., Ltd., Wuhan, Hubei (CN)

(72) Inventor: Shimin Chen, Guangdong (CN)

(73) Assignee: WUHAN CHINA STAR OPTOELECTRONICS SEMICONDUCTOR DISPLAY TECHNOLOGY CO., LTD., Wuhan, Hubei (CN)

(*) Notice: Subject to any disclaimer, the term of this patent is extended or adjusted under 35 U.S.C. 154(b) by 0 days.

(21) Appl. No.: 16/124,890

(22) Filed: Sep. 7, 2018

(65) Prior Publication Data
US 2019/0058122 A1 Feb. 21, 2019

Related U.S. Application Data

(63) Continuation of application No. PCT/CN2017/101964, filed on Sep. 15, 2017.

(30) Foreign Application Priority Data

Aug. 16, 2017 (CN) .......................... 2017 1 0702626

(51) Int. Cl.
*B32B 43/00* (2006.01)
*H01L 51/00* (2006.01)
(Continued)

(52) U.S. Cl.
CPC .......... *H01L 51/003* (2013.01); *B32B 43/006* (2013.01); *B65G 49/067* (2013.01);
(Continued)

(58) Field of Classification Search
CPC . B32B 38/10; B32B 43/006; Y10T 156/1132; Y10T 156/1184; Y10T 156/1944; Y10T 156/1967
(Continued)

(56) References Cited

U.S. PATENT DOCUMENTS

| 7,281,739 B2 * | 10/2007 | Kniss | B25J 13/086 294/65 |
| 7,740,735 B2 * | 6/2010 | Kerdiles | G01N 19/04 156/707 |

(Continued)

FOREIGN PATENT DOCUMENTS

| CN | 1754629 A | 4/2006 |
| CN | 1948004 A | 4/2007 |

(Continued)

*Primary Examiner* — Mark A Osele
*Assistant Examiner* — Nickolas R Harm
(74) *Attorney, Agent, or Firm* — Leong C. Lei

(57) ABSTRACT

Disclosed are a glass substrate separation device and a glass substrate separation method. A plurality of first vacuum adsorption devices is adsorbed on one end of the glass substrate to separate the one end of the glass substrate and an OLED with an opening with a certain distance, and a metal wire is driven to enter the opening, and abuts a lower surface of the glass substrate to move to the other end of the glass substrate to accomplish the separation between the glass substrate and the OLED; and then, a second vacuum adsorption device is adsorbed at an intermediate position of the glass substrate to remove the glass substrate from the OLED to realize a glass substrate removal process after a LLO in an OLED module production, thereby avoiding a damage to the OLED and a PI layer disposed on a surface layer of the OLED.

16 Claims, 7 Drawing Sheets

(51) Int. Cl.
*B65G 49/06* (2006.01)
*H01L 51/56* (2006.01)
*B32B 38/10* (2006.01)

(52) U.S. Cl.
CPC .............. *H01L 51/56* (2013.01); *B32B 38/10* (2013.01); *B32B 2457/206* (2013.01); *B65G 2249/04* (2013.01); *Y10T 156/1132* (2015.01); *Y10T 156/1184* (2015.01); *Y10T 156/1944* (2015.01); *Y10T 156/1967* (2015.01)

(58) Field of Classification Search
USPC .............. 156/707, 717, 758, 762, 924, 937
See application file for complete search history.

(56) References Cited

U.S. PATENT DOCUMENTS

| | | | |
|---|---|---|---|
| 8,141,611 B2 * | 3/2012 | Lai | B23D 49/02 |
| | | | 156/701 |
| 8,470,129 B1 * | 6/2013 | Wang | B32B 38/10 |
| | | | 156/705 |
| 8,858,859 B2 * | 10/2014 | Song | B82Y 10/00 |
| | | | 156/707 |
| 9,623,648 B2 * | 4/2017 | Kim | B32B 43/006 |
| 9,731,492 B2 * | 8/2017 | Lee | B32B 43/006 |
| 9,793,518 B2 * | 10/2017 | Choi | H01L 51/56 |
| 9,805,953 B2 * | 10/2017 | Ohno | H01L 21/6838 |
| 2003/0121601 A1 * | 7/2003 | Tajima | G09F 7/18 |
| | | | 156/254 |
| 2011/0198040 A1 * | 8/2011 | Ebata | B65H 41/00 |
| | | | 156/750 |
| 2014/0145587 A1 | 5/2014 | Yoon | |
| 2014/0150981 A1 * | 6/2014 | Itou | B32B 38/1858 |
| | | | 156/714 |
| 2014/0231001 A1 * | 8/2014 | Tsai | B32B 37/1284 |
| | | | 156/247 |
| 2015/0059986 A1 * | 3/2015 | Komatsu | B26D 3/08 |
| | | | 156/510 |
| 2015/0059987 A1 * | 3/2015 | Kumakura | B32B 43/006 |
| | | | 156/714 |
| 2015/0217556 A1 * | 8/2015 | Lee | B32B 43/006 |
| | | | 156/702 |
| 2016/0031106 A1 * | 2/2016 | Wu | B26D 3/28 |
| | | | 83/15 |
| 2016/0176181 A1 * | 6/2016 | Kim | B32B 43/006 |
| | | | 156/701 |
| 2016/0207298 A1 * | 7/2016 | Kim | B32B 43/006 |
| 2017/0305134 A1 * | 10/2017 | Hirakata | B32B 27/08 |
| 2018/0108558 A1 * | 4/2018 | Yin | H01L 21/67 |

FOREIGN PATENT DOCUMENTS

| | | |
|---|---|---|
| CN | 2932617 Y | 8/2007 |
| CN | 102171745 A | 8/2011 |
| CN | 102666333 A | 9/2012 |
| CN | 102983062 A | 3/2013 |
| CN | 102983063 A | 3/2013 |
| CN | 103424910 A | 12/2013 |
| CN | 203910868 U | 10/2014 |
| CN | 104347449 A | 2/2015 |
| CN | 104950495 A | 9/2015 |
| CN | 105511130 A | 4/2016 |
| CN | 105745168 A | 7/2016 |
| CN | 105762280 A | 7/2016 |
| CN | 107686007 A | 2/2018 |

* cited by examiner

GLASS SUBSTRATE SEPARATION METHOD AND GLASS SUBSTRATE SEPARATION DEVICE

CROSS-REFERENCE TO RELATED APPLICATION

This application is a continuing application of PCT Patent Application No. PCT/CN2017/101964 entitled "Glass substrate separation method and glass substrate separation device", filed on Sep. 15, 2017, which claims priority to Chinese Patent Application No. 201710702626.0, filed on Aug. 16, 2017, both of which are hereby incorporated in its entireties by reference.

FIELD OF THE INVENTION

The present invention relates to a display field, and more particularly to a glass substrate separation method and a glass substrate separation device.

BACKGROUND OF THE INVENTION

In the field of liquid crystal display, the thinness of the liquid crystal display is a development trend. Especially with the continuous advancement of display technology, the thinness is the characteristics of flexible OLED modules in the development and production of flexible organic light-emitting diode (OLED) modules. The OLED module generally includes a glass substrate, an OLED and a PI (Polyimide) layer between the glass substrate and the OLED, and the PI layer serves as a surface layer of the OLED, and possesses a thickness of about 20 micrometers. Therefore, it is easily damaged by force.

In the production of the OLED module, the glass substrate needs to be removed from the OLED after laser lift off (LLO), which is called a removal (D-lami) process. In the prior art, the glass substrate is mostly removed by direct lifting off, that is, the glass substrate is sucked by the nozzle, and then the nozzle drives the glass substrate to move upward, so that the glass substrate and the OLED are completely separated. However, the aforesaid direct lifting off method has a large pulling force acting on the OLED, and easily damages the PI layer disposed on the surface layer of the OLED, thereby causing damage to the OLED, resulting in a yield drop of the OLED modules.

SUMMARY OF THE INVENTION

The embodiment of the present invention provides a glass substrate separation method and a glass substrate separation device, which can improve the glass substrate removal process after the LLO (Laser Lift Off) in the OLED module production, and can prevent the OLED and the PI layer disposed on the surface layer of the OLED from being damaged, thereby improving the yield of the OLED module.

First, the embodiment of the present invention provides a glass substrate separation device, separating a glass substrate from an organic light emitting diode (OLED). The glass substrate separation device comprises a lifting off platform, a plurality of first vacuum adsorption devices, a separation wire and a second vacuum adsorption device, wherein the OLED is adsorbed and fixed on the lifting off platform, and the plurality of first vacuum adsorption devices is adsorbed on a first position of the glass substrate and separates the glass substrate from the OLED to form an opening, wherein a diameter of the opening is larger than a diameter of the separation wire, and the separation wire is moved from the opening at one end of the glass substrate to the other end of the glass substrate against a lower surface of the glass substrate to separate the glass substrate from the OLED, and the second vacuum adsorption device is adsorbed on a second position of the glass substrate to remove the glass substrate from the OLED.

The lifting off platform is provided with a plurality of vacuum holes, and the OLED is placed on the lifting off platform and corresponds to positions of the plurality of vacuum holes, and the vacuum holes are connected to a vacuum device to adsorb the OLED on the lifting off platform.

The glass substrate separation device further comprises a first driving device, driving the first vacuum adsorption device to move in a direction toward the glass substrate so that the first vacuum adsorption device is adsorbed on the first position of the glass substrate.

The glass substrate separation device further comprises a control unit, controlling the separation wire to enter the opening of the one end of the glass substrate and abuts the lower surface of the glass substrate, and controlling the separation wire to move toward the other end of the glass substrate at a predetermined rate, wherein the separation wire is not in contact with a polyimide layer as a surface layer of the OLED during a whole moving process.

The glass substrate separation device further comprises a second driving device, driving the second vacuum adsorption device to move in a direction toward the glass substrate so that the second vacuum adsorption device is adsorbed on the second position of the glass substrate; wherein the second driving device further drives the second vacuum adsorption device to move in a direction away from the OLED, and the glass substrate is raised at a predetermined rate by the second vacuum adsorption device to remove the glass substrate from the OLED.

The first position is at an edge of the one end of the glass substrate, and the second vacuum adsorption device is a folding vacuum suction nozzle; the second position is at an intermediate position of the glass substrate, and the second vacuum adsorption device is a folding vacuum suction nozzle, and a size of the second vacuum adsorption device is larger than a size of the first vacuum adsorption device.

Second, the embodiment of the present invention further provides a glass substrate separation method, separating a glass substrate from an organic light emitting diode (OLED). The glass substrate separation method comprises:

providing a lifting off platform for adsorbing and fixing the OLED thereon;

separating the glass substrate from the OLED to form an opening with a plurality of first vacuum adsorption devices adsorbed on a first position of the glass substrate, wherein a diameter of the opening is larger than a diameter of a separation wire;

moving the separation wire from the opening at one end of the glass substrate to the other end of the glass substrate against a lower surface of the glass substrate to separate the glass substrate from the OLED while moving the plurality of first vacuum adsorption devices; and removing the glass substrate from the OLED with a second vacuum adsorption device adsorbed on a second position of the glass substrate.

Separating the glass substrate from the OLED to form the opening with the plurality of first vacuum adsorption devices adsorbed on the first position of the glass substrate, wherein the diameter of the opening is larger than the diameter of the separation wire, comprises:

driving the plurality of first vacuum adsorption devices to move in a direction toward the glass substrate to be adsorbed on the first position of the glass substrate;

driving the plurality of first vacuum adsorption devices to move in a direction away from the OLED to separate the glass substrate from the OLED to form the opening inbetween.

Removing the glass substrate from the OLED with a second vacuum adsorption device adsorbed on a second position of the glass substrate, comprises:

driving the second vacuum adsorption device to move in a direction toward the glass substrate to be adsorbed on the second position of the glass substrate;

driving the second vacuum adsorption device to move in a direction away from the OLED to remove the glass substrate from the OLED.

The first position is at an edge of the one end of the glass substrate, and the second vacuum adsorption device is a folding vacuum suction nozzle; the second position is at an intermediate position of the glass substrate, and the second vacuum adsorption device is a folding vacuum suction nozzle, and a size of the second vacuum adsorption device is larger than a size of the first vacuum adsorption device.

In conclusion, in the glass substrate separation device and the glass substrate separation method provided by the embodiment of the present invention, the plurality of first vacuum adsorption devices is adsorbed on the one end of the glass substrate to separate the one end of the glass substrate and the OLED with the opening with a certain distance, and the metal wire is driven to enter the opening at the one end of the glass substrate, and abuts the lower surface of the glass substrate to move to the other end of the glass substrate to accomplish the separation between the glass substrate and the OLED; and then, the second vacuum adsorption device is adsorbed at an intermediate position of the glass substrate to remove the glass substrate from the OLED to realize the glass substrate removal process after the LLO in the OLED module production, thereby avoiding the damage to the OLED and the PI layer disposed on the surface layer of the OLED for improving the yield of OLED modules.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Figure 1:
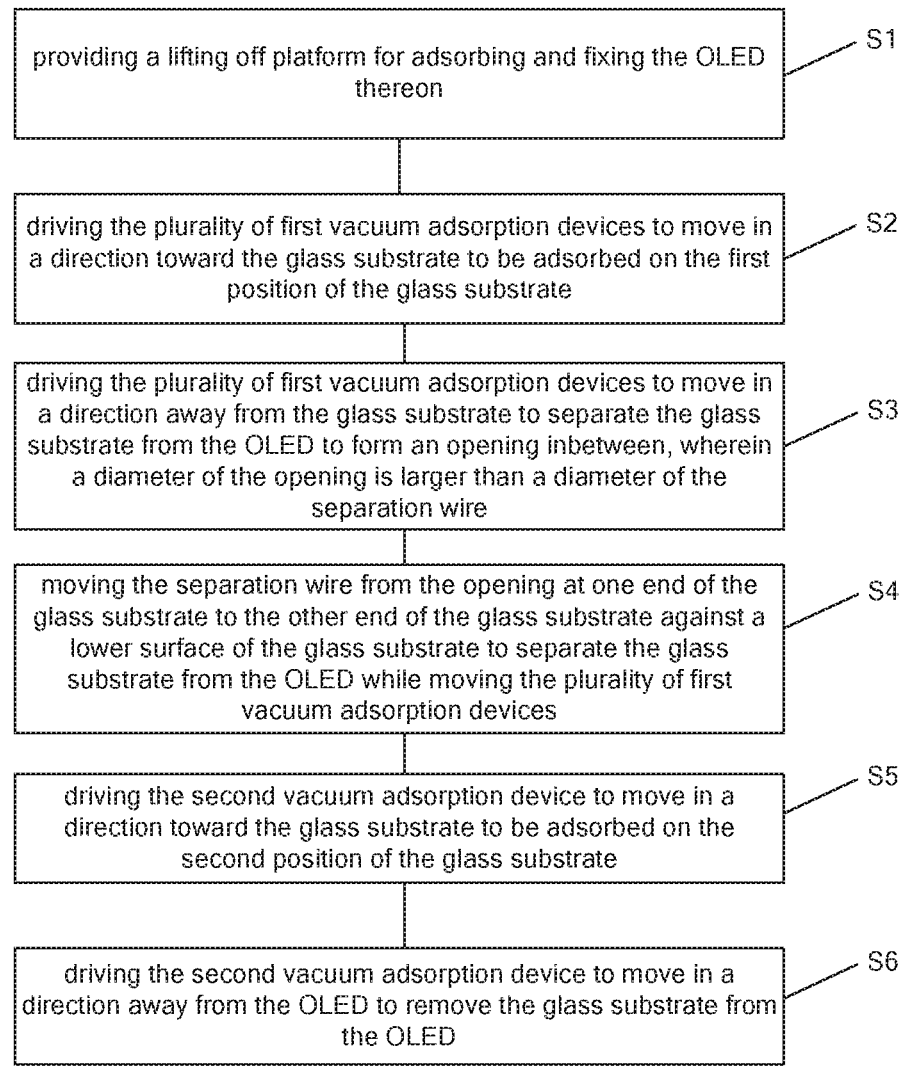
FIG. 1 is a flowchart of a glass substrate separation method according to an embodiment of the present invention.

For better explaining the technical solution and the effect of the present invention, the present invention will be further described in detail with the accompanying drawings in the specific embodiments. It is clear that the described embodiments are part of embodiments of the present application, but not all embodiments. Based on the embodiments of the present invention, all other embodiments to those of ordinary skill in the premise of no creative efforts obtained, should be considered within the scope of protection of the present invention.

Besides, the following descriptions for the respective embodiments are specific embodiments capable of being implemented for illustrations of the present invention with referring to appended figures. For example, the terms of up, down, front, rear, left, right, interior, exterior, side, etcetera are merely directions of referring to appended figures. Therefore, the wordings of directions are employed for explaining and understanding the present invention but not limitations thereto.

In the description of the invention, which needs explanation is that the term "installation", "connected", "connection" should be broadly understood unless those are clearly defined and limited, otherwise, For example, those can be a fixed connection, a detachable connection, or an integral connection; those can be a mechanical connection, or an electrical connection; those can be a direct connection, or an indirect connection with an intermediary, which may be an internal connection of two elements. To those of ordinary skill in the art, the specific meaning of the above terminology in the present invention can be understood in the specific circumstances.

Besides, in the description of the present invention, unless with being indicated otherwise, "plurality" means two or more. In the present specification, the term "process" encompasses an independent process, as well as a process that cannot be clearly distinguished from another process but yet achieves the expected effect of the process of interest. Moreover, in the present specification, any numerical range expressed herein using "to" refers to a range including the numerical values before and after "to" as the minimum and maximum values, respectively. In figures, the same reference numbers will be used to refer to the same or like parts.

The embodiment of the present invention provides a glass substrate separation device and a glass substrate separation method. The glass substrate and the OLED are separated by using the separation wire. The glass substrate is removed from the OLED by the second vacuum adsorption device, thereby realizing the glass substrate removal process after the LLO in the OLED module production, and thereby avoiding the damage to the OLED and the PI layer disposed on the surface layer of the OLED for improving the yield of OLED modules. The glass substrate separation device and the glass substrate separation method provided by the embodiments of the present invention will be described in detail below with reference to FIGS. 1 to 13.

Please refer to FIG. 1. FIG. 1 is a flowchart of a glass substrate separation method according to an embodiment of the present invention. The glass substrate separation method according to the embodiment of the present invention at least comprises steps of:

S1, providing a lifting off (D-lami) platform for adsorbing and fixing the Organic Light Emitting Diode (OLED) thereon.

Figure 2:
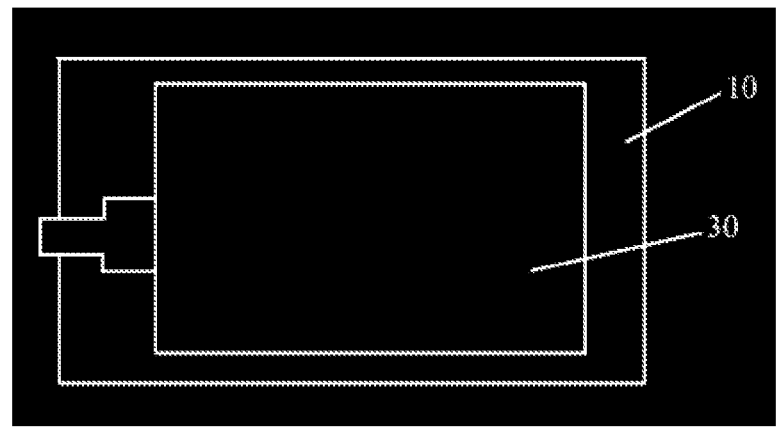
FIG. 2 is a top view diagram of a lifting off platform on which a glass substrate is placed according to an embodiment of the present invention.
Figure 3:
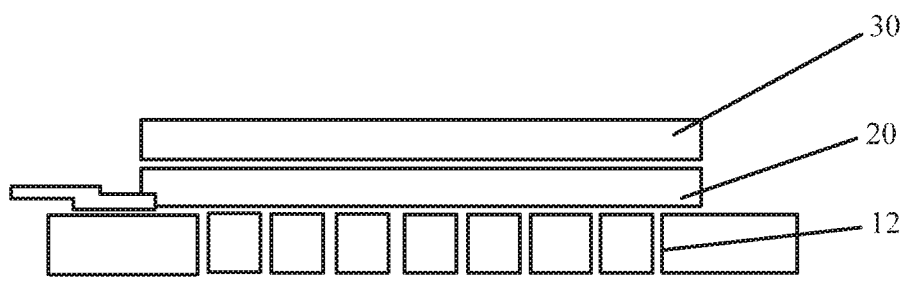
FIG. 3 is a front view diagram of the lifting off platform on which a glass substrate is placed shown in FIG. 2.

Please refer to FIG. 2 and FIG. 3. Specifically, in the embodiment of the present invention, the lifting off platform 10 is provided with a plurality of vacuum holes 12. The vacuum holes 12 penetrate the upper and lower surfaces of the lifting off platform 10. The OLED 20 is placed on the lifting off platform 10 and corresponds to positions of the plurality of vacuum holes 12. Namely, the lower surface (defined as the first surface) of the OLED 20 is located on the plurality of vacuum holes 12. The vacuum holes 12 are connected to a vacuum device (such as an air suction machine, air pump and etc.) to adsorb the OLED 20 on the lifting off platform 10.

The OLED 20 is provided with a glass substrate 30 thereon. Specifically, the glass substrate 30 is disposed on an upper surface (defined as the second surface) of the OLED 20. Specifically, in the production of the OLED module, the glass substrate 30 needs to be removed from the OLED 20 after laser lift off (LLO), which is called a removal (D-lami) process.

S2, driving the plurality of first vacuum adsorption devices to move in a direction toward the glass substrate to be adsorbed on the first position of the glass substrate.

Figure 4:
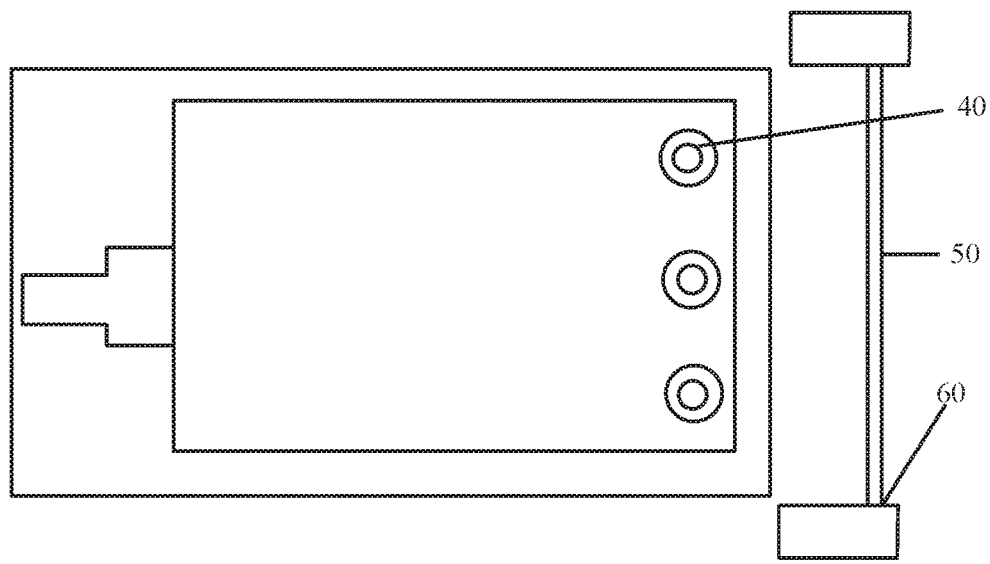
FIG. 4 is a top view diagram of a first vacuum adsorption device adsorbing a glass substrate according to an embodiment of the present invention.
Figure 5:
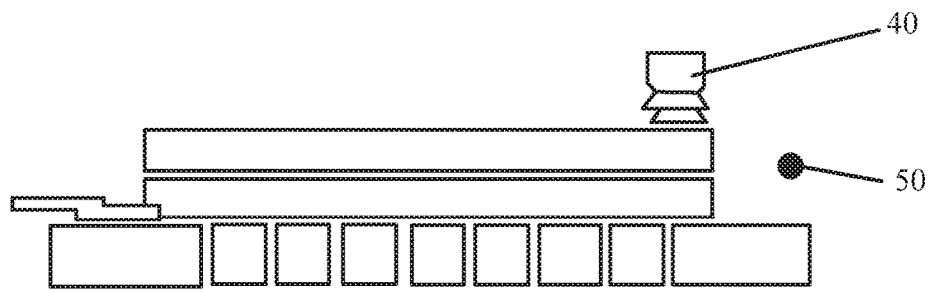
FIG. 5 is a front view diagram of a first vacuum adsorption device adsorbing a glass substrate shown in FIG. 4.

Please refer to FIG. 4 and FIG. 5. Specifically, in the embodiment of the present invention, after the OLED 20 is adsorbed on the lifting off platform 10, the first vacuum adsorption device 40 is driven to move in a direction toward the glass substrate 30 by a first driving device (such as a robot or the like, not shown) and to press at the first position of the glass substrate 30. Then, the first vacuum adsorption device 40 can be adsorbed on the first position of the glass substrate 30. In an embodiment of the invention, the first position is at an edge of one end of the glass substrate 30. The first vacuum adsorption device 40 can be a vacuum nozzle, and specifically can be a folding vacuum suction nozzle having a certain amount of deformation. The plurality of the first vacuum adsorption devices 40 are juxtaposed at the edge of the one end of the glass substrate 30.

Specifically, a lifting off layer (not shown) is disposed between the OLED 20 and the glass substrate 30. In an embodiment of the present invention, a material of the laser lifting off layer is a polymer (i.e. polyimide (PI)) with a main chain containing an imide group (—CO—N—CO—). That is to say, the lifting off layer is a PI layer. The PI layer is between the glass substrate 30 and the OLED 20, and the PI layer serves as a surface layer of the OLED 20.

S3, driving the plurality of first vacuum adsorption devices to move in a direction away from the glass substrate to separate the glass substrate from the OLED to form an opening inbetween, wherein a diameter of the opening is larger than a diameter of the separation wire.

Figure 6:
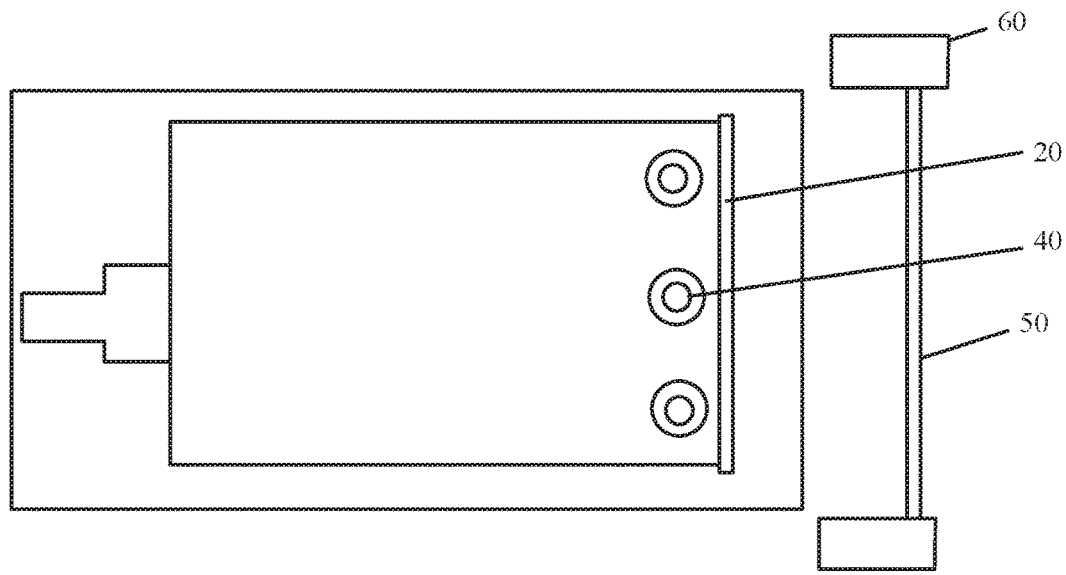
FIG. 6 is a top view diagram of the first vacuum adsorption device shown in FIG. 4 adsorbing up the glass substrate.
Figure 7:
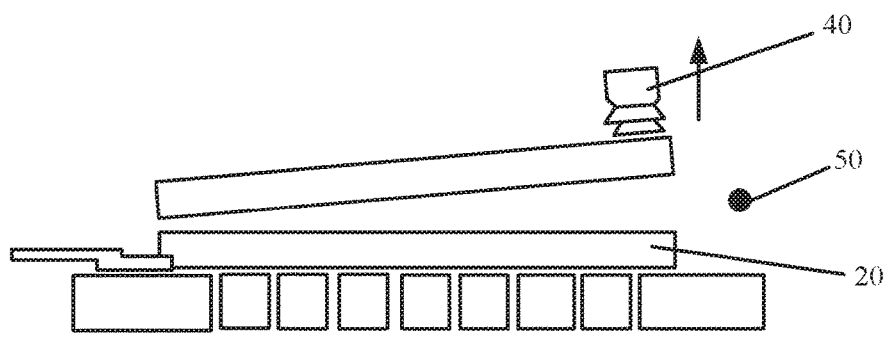
FIG. 7 is a front view diagram of the first vacuum adsorption device shown in FIG. 6 adsorbing up the glass substrate.

Please refer to FIG. 6 and FIG. 7. Specifically, in the embodiment of the present invention, after the first vacuum adsorption device 40 is adsorbed on the edge position of the one end of the glass substrate 30, the first driving device drives the first vacuum adsorption device 40 to move in a direction away from the OLED 20. The one end of the glass substrate 30 is lifted at a certain rate by the first vacuum adsorption device 40, and is gradually separated from the OLED 20, thereby forming an opening 23 between the one end of the OLED 20 and the glass substrate 30. A diameter of the opening 23 (a distance between the edge of the OLED 20 and the edge of the glass substrate 30) is larger than a diameter of the separation wire 50 such that the separation wire 50 can smoothly enter the opening 23 and gradually separate the glass substrate 30 from the OLED 20. In the embodiment of the present invention, the separation wire 50 can be a metal wire.

S4, moving the separation wire from the opening at one end of the glass substrate to the other end of the glass substrate against a lower surface of the glass substrate to separate the glass substrate from the OLED while moving the plurality of first vacuum adsorption devices.

Figure 8:
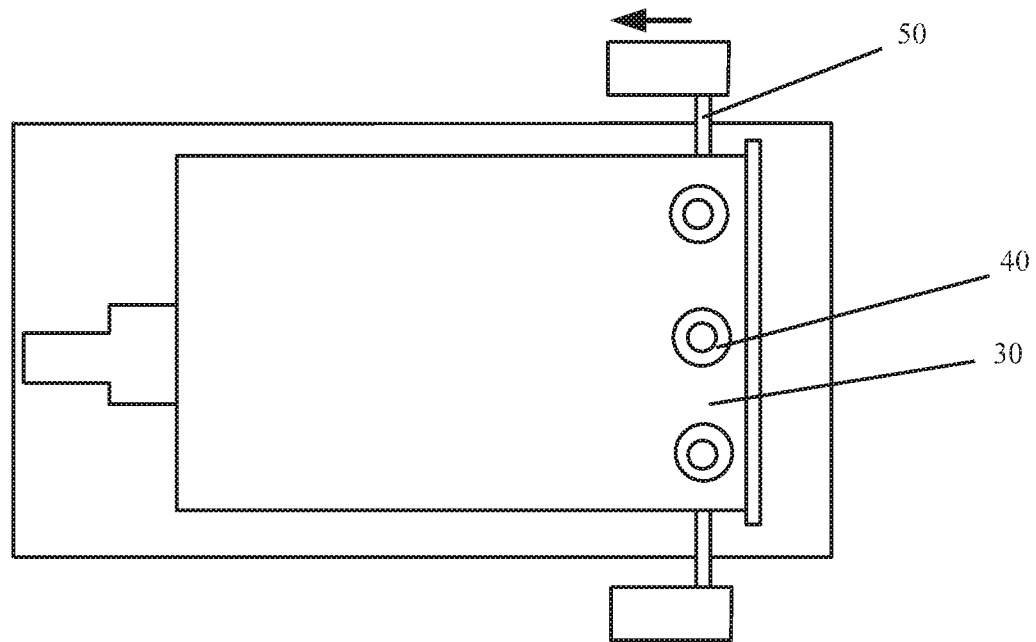
FIG. 8 is a top view diagram of a separation wire at one end of the glass substrate according to an embodiment of the present invention.
Figure 9:
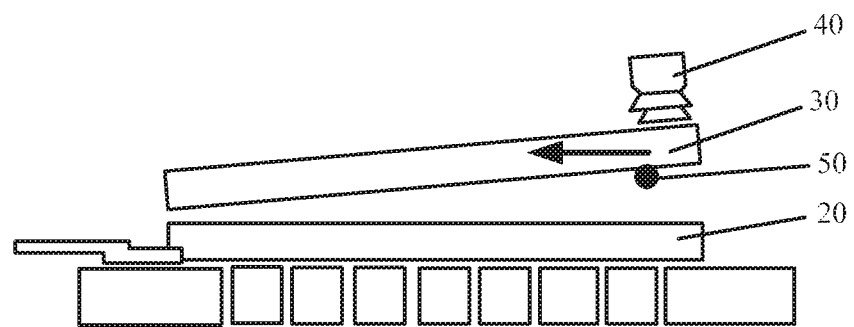
FIG. 9 is a front view diagram of the separation wire shown in FIG. 8 at one end of the glass substrate.

Please refer to FIG. 8 and FIG. 9. Specifically, in the embodiment of the present invention, when one end of the glass substrate 30 is lifted at a certain rate and the opening 23 is formed by the first vacuum adsorption device 40, the separation wire 50 is controlled by the control unit 60 (such as a controller, a microprocessor and etc.) to enter the opening 23 and abuts the lower surface of the glass substrate 30 (i.e., the surface the glass substrate 30 opposite to the OLED 20). Then, the separation wire 50 is moved to the other end of the glass substrate 30 at a predetermined rate under the control of the control unit 60, and is not in contact with the polyimide layer during a whole moving process.

Figure 10:
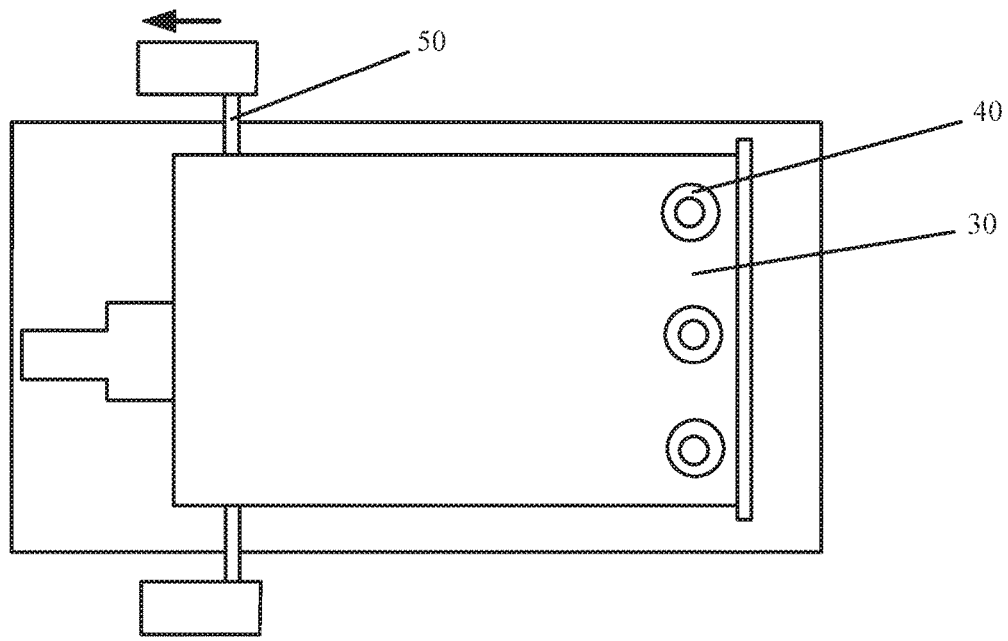
FIG. 10 is a top view diagram of the separation wire shown in FIG. 8 at the other end of the glass substrate.
Figure 11:
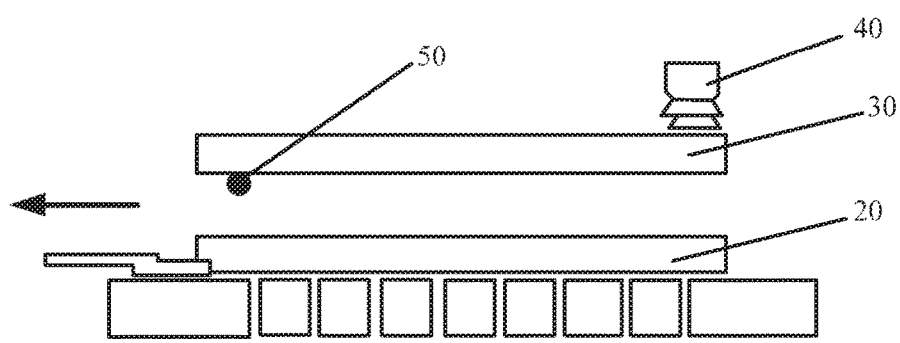
FIG. 11 is a front view diagram of the separation wire shown in FIG. 10 at the other end of the glass substrate.

Please refer to FIG. 10 and FIG. 11. As the glass substrate 30 is gradually separated from the OLED 20, the first vacuum adsorption device 40 is constantly adsorbed on the edge of the one end of the glass substrate 30. When the separation wire 50 is moved to the other end of the glass substrate 30 at a predetermined rate under the control of the control unit 60, the glass substrate 30 is completely separated from the OLED 20. Then, the separation wire 50 stops moving. Namely, one end of the glass substrate 30 is adsorbed and fixed by the first vacuum adsorption device 40, and the other end thereof is carried on the separation wire 50.

S5, driving the second vacuum adsorption device to move in a direction toward the glass substrate to be adsorbed on the second position of the glass substrate.

Figure 12:
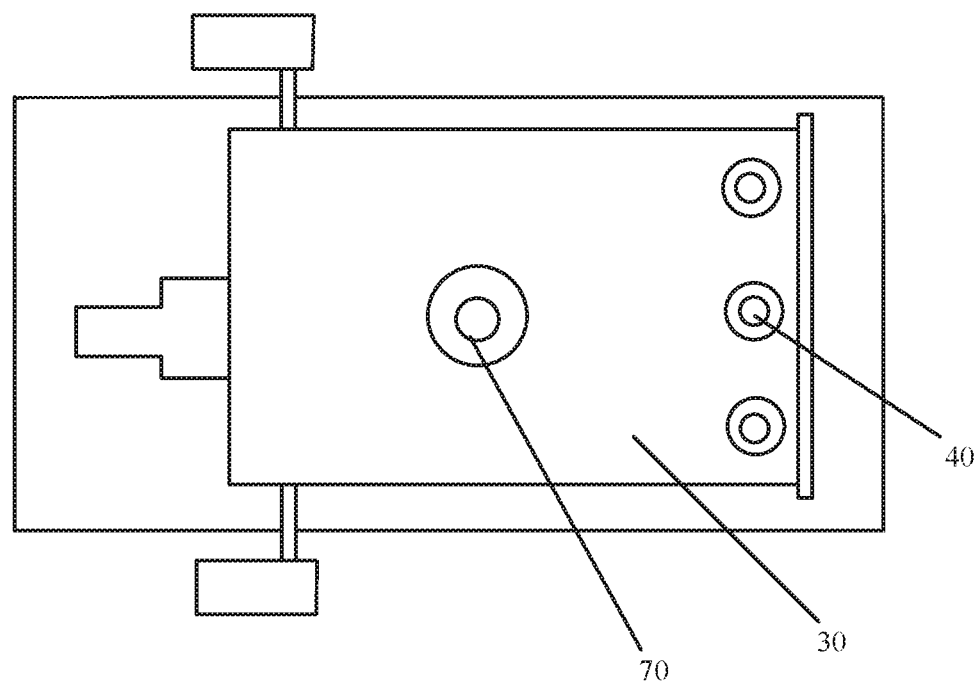
FIG. 12 is a top view diagram of a second vacuum adsorption device adsorbing up the glass substrate according to an embodiment of the present invention.
Figure 13:
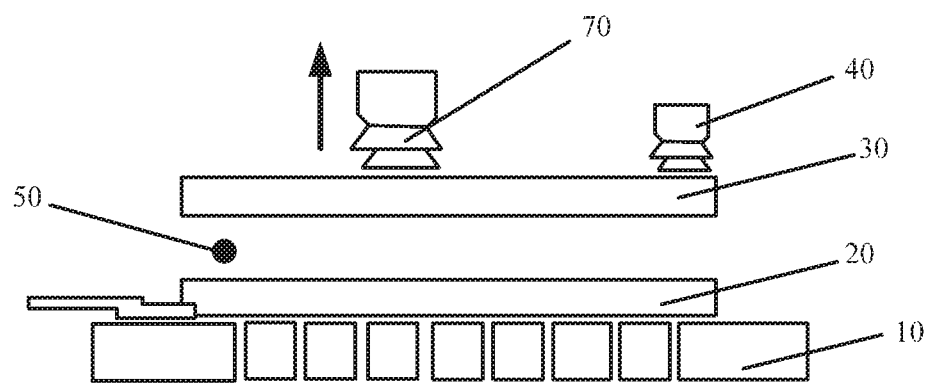
FIG. 13 is a front view diagram of the second vacuum adsorption device shown in FIG. 12 adsorbing up the glass substrate.

Please refer to FIG. 12 and FIG. 13. Specifically, in the embodiment of the present invention, after the glass substrate 30 and the OLED 20 are completely separated, the second vacuum adsorption device 70 is driven to move in a direction toward the glass substrate 30 by a second driving device (such as a robot or the like, not shown) and to press on the second position of the glass substrate 30. Then, the second vacuum adsorption device 70 is adsorbed on the second position of the glass substrate 30. In an embodiment of the invention, the second position is at an intermediate position of the glass substrate 30. The second vacuum adsorption device 70 can be a vacuum nozzle, and specifically can be a folding vacuum suction nozzle having a certain amount of deformation. Meanwhile, a size of the second vacuum adsorption device 70 is larger than a size of the first vacuum adsorption device 40.

S6, driving the second vacuum adsorption device to move in a direction away from the OLED to remove the glass substrate from the OLED.

Specifically, in the embodiment of the present invention as shown in FIG. 12 and FIG. 13, after the second vacuum adsorption device 70 is adsorbed at the intermediate position of the glass substrate 30, the second driving device drives the second vacuum adsorption device 70 to move in a direction away from the OLED 20, and the glass substrate 30 is lifted at a predetermined rate by the second vacuum adsorption device 70 to remove the glass substrate 30 from the OLED 20.

The embodiment of the present invention further provides a glass substrate separation device. The glass substrate separation device is used to remove the glass substrate 30 from the OLED 20. The OLED 20 is provided with a glass substrate 30 thereon. Specifically, the glass substrate 30 is disposed on an upper surface (defined as the second surface) of the OLED 20. Specifically, in the production of the OLED module, the glass substrate 30 needs to be removed from the OLED 20 after laser lift off (LLO), which is called a removal (D-lami) process.

In an embodiment of the invention, as shown in FIGS. 2 to 9, the glass substrate separation device comprises a lifting off (D-lami) platform 10. Specifically, in an embodiment of the present invention, the lifting off platform 10 is provided with a plurality of vacuum holes 12. The vacuum holes 12 penetrate the upper and lower surfaces of the lifting off platform 10. The OLED 20 is placed on the lifting off platform 10 and corresponds to positions of the plurality of vacuum holes 12. Namely, the lower surface (defined as the first surface) of the OLED 20 is located on the plurality of vacuum holes 12. The vacuum holes 12 are connected to a vacuum device (such as an air suction machine, air pump and etc.) to adsorb the OLED 20 on the lifting off platform 10.

The glass substrate separation device further comprises a plurality of first vacuum adsorption devices 40 and a first driving device (not shown). After the OLED 20 is adsorbed on the lifting off platform 10, the first vacuum adsorption device 40 is driven to move in a direction toward the glass substrate 30 by a first driving device (such as a robot or the like) and to press at the first position of the glass substrate 30. Then, the first vacuum adsorption device 40 can be adsorbed on the first position of the glass substrate 30. In an embodiment of the invention, the first position means an edge of one end of the glass substrate 30. The first vacuum adsorption device 40 can be a vacuum nozzle, and specifically can be a folding vacuum suction nozzle having a certain amount of deformation. The plurality of the first vacuum adsorption devices 40 are juxtaposed at the edge of the one end of the glass substrate 30.

Specifically, a lifting off layer (not shown) is disposed between the OLED 20 and the glass substrate 30. In an embodiment of the present invention, a material of the laser lifting off layer is a polymer (i.e. polyimide (PI)) with a main chain containing an imide group (—CO—N—CO—). That is to say, the lifting off layer is a PI layer. The PI layer is between the glass substrate 30 and the OLED 20, and the PI layer serves as a surface layer of the OLED 20.

The glass substrate separation device further comprises a separation wire 50. In an embodiment of the invention, the separation wire 50 may be a metal wire. After the first vacuum adsorption device 40 is adsorbed on the edge position of the one end of the glass substrate 30, the first driving device drives the first vacuum adsorption device 40 to move in a direction away from the OLED 20. The one end of the glass substrate 30 is lifted at a certain rate by the first vacuum adsorption device 40, and is gradually separated from the OLED 20, thereby forming an opening 23 between the one end of the OLED 20 and the glass substrate 30. A diameter of the opening 23 (a distance between the edge of the OLED 20 and the edge of the glass substrate 30) is larger than a diameter of the separation wire 50 such that the separation wire 50 can smoothly enter the opening 23 and gradually separate the glass substrate 30 from the OLED 20.

When one end of the glass substrate 30 is lifted at a certain rate and the opening 23 is formed by the first vacuum adsorption device 40, the separation wire 50 is controlled by the control unit 60 (such as a controller, a microprocessor and etc.) to enter the opening 23 and abuts the lower surface of the glass substrate 30 (i.e., the surface the glass substrate 30 opposite to the OLED 20). Then, the separation wire 50 is moved to the other end of the glass substrate 30 at a predetermined rate under the control of the control unit 60, and is not in contact with the polyimide layer during a whole moving process.

Please refer to FIG. 10 and FIG. 11. As the glass substrate 30 is gradually separated from the OLED 20, the first vacuum adsorption device 40 is constantly adsorbed on the edge of the one end of the glass substrate 30. When the separation wire 50 is moved to the other end of the glass substrate 30 at a predetermined rate under the control of the control unit 60, the glass substrate 30 is completely separated from the OLED 20. Then, the separation wire 50 stops moving. Namely, one end of the glass substrate 30 is adsorbed and fixed by the first vacuum adsorption device 40, and the other end thereof is carried on the separation wire 50.

Please refer to FIG. 12 and FIG. 13. The glass substrate separation device further comprises a second vacuum adsorption device 70 and a second driving device (not shown). After the glass substrate 30 and the OLED 20 are completely separated, the second vacuum adsorption device 70 is driven to move in a direction toward the glass substrate 30 by a second driving device (such as a robot or the like) and to press on the second position of the glass substrate 30. Then, the second vacuum adsorption device 70 is adsorbed on the second position of the glass substrate 30. In an embodiment of the invention, the second position is at an intermediate position of the glass substrate 30. The second vacuum adsorption device 70 can be a vacuum nozzle, and specifically can be a folding vacuum suction nozzle having a certain amount of deformation. Meanwhile, a size of the second vacuum adsorption device 70 is larger than a size of the first vacuum adsorption device 40.

After the second vacuum adsorption device 70 is adsorbed at the intermediate position of the glass substrate 30, the second driving device drives the second vacuum adsorption device 70 to move in a direction away from the OLED 20, and the glass substrate 30 is lifted at a predetermined rate by the second vacuum adsorption device 70 to remove the glass substrate 30 from the OLED 20.

In the glass substrate separation device and the glass substrate separation method provided by the embodiment of the present invention, the plurality of first vacuum adsorption devices 40 is adsorbed on the one end of the glass substrate 30 to separate the one end of the glass substrate 30 and the OLED 20 with the opening with a certain distance, and the metal wire is driven to enter the opening at the one end of the glass substrate 30, and abuts the lower surface of the glass substrate 30 to move to the other end of the glass substrate 30 to accomplish the separation between the glass substrate 30 and the OLED 20; and then, the second vacuum adsorption device 70 is adsorbed at an intermediate position of the glass substrate 30 to remove the glass substrate 30 from the OLED 20 to realize the glass substrate removal process after the LLO in the OLED module production, thereby avoiding the damage to the OLED and the PI layer disposed on the surface layer of the OLED for improving the yield of OLED modules.

In the description of the present specification, the reference terms, "one embodiment", "some embodiments", "an illustrative embodiment", "an example", "a specific example", or "some examples" mean that such description combined with the specific features of the described embodiments or examples, structure, material, or characteristic is included in the utility model of at least one embodiment or example. In the present specification, the terms of the above schematic representation do not certainly refer to the same embodiment or example. Meanwhile, the particular features, structures, materials, or characteristics which are described may be combined in a suitable manner in any one or more embodiments or examples.

The detail description has been introduced above for the glass substrate separation method and the glass substrate separation device provided by the embodiment of the invention. Herein, a specific case is applied in this article for explain the principles and specific embodiments of the present invention have been set forth. The description of the aforesaid embodiments is only used to help understand the method of the present invention and the core idea thereof; meanwhile, for those of ordinary skill in the art, according to the idea of the present invention, there should be changes either in the specific embodiments and applications but in sum, the contents of the specification should not be limitation to the present invention.

What is claimed is:

1. A glass substrate separation device, separating a glass substrate from an organic light emitting diode (OLED), wherein the glass substrate separation device comprises a lifting off platform, a plurality of first vacuum adsorption devices, a separation wire and a second vacuum adsorption device, wherein the OLED is adsorbed and fixed on the lifting off platform, and the plurality of first vacuum adsorption devices is adsorbed on a first position of the glass substrate and separates the glass substrate from the OLED to form an opening, wherein a distance between an edge of the OLED and an edge of the glass substrate is larger than the separation wire, and the separation wire is moved from the opening at one end of the glass substrate to the other end of the glass substrate against a lower surface of the glass substrate to separate the glass substrate from the OLED, and the second vacuum adsorption device is adsorbed on a second position of the glass substrate to remove the glass substrate from the OLED.

2. The glass substrate separation device according to claim 1, wherein the lifting off platform is provided with a plurality of vacuum holes, and the OLED is placed on the lifting off platform, and the vacuum holes are connected to a vacuum device to adsorb the OLED on the lifting off platform.

3. The glass substrate separation device according to claim 2, wherein the first position is at an edge of the one end of the glass substrate, and a first vacuum adsorption device is a folding vacuum suction nozzle; the second position is at an intermediate position of the glass substrate, and the second vacuum adsorption device is a folding vacuum suction nozzle, and a size of the second vacuum adsorption device is larger than a size of the first vacuum adsorption device.

4. The glass substrate separation device according to claim 1, further comprising a first driving device, driving a first vacuum adsorption device to move in a direction toward the glass substrate so that the first vacuum adsorption device is adsorbed on the first position of the glass substrate.

5. The glass substrate separation device according to claim 4, further comprising a second driving device, driving the second vacuum adsorption device to move in a direction toward the glass substrate so that the second vacuum adsorption device is adsorbed on the second position of the glass substrate; wherein the second driving device further drives the second vacuum adsorption device to move in a direction away from the OLED, and the glass substrate is raised at a predetermined rate by the second vacuum adsorption device to remove the glass substrate from the OLED.

6. The glass substrate separation device according to claim 5, wherein the first position is at an edge of the one end of the glass substrate, and the first vacuum adsorption device is a folding vacuum suction nozzle; the second position is at an intermediate position of the glass substrate, and the second vacuum adsorption device is a folding vacuum suction nozzle, and a size of the second vacuum adsorption device is larger than a size of the first vacuum adsorption device.

7. The glass substrate separation device according to claim 4, wherein the first position is at an edge of the one end of the glass substrate, and the first vacuum adsorption device is a folding vacuum suction nozzle; the second position is at an intermediate position of the glass substrate, and the second vacuum adsorption device is a folding vacuum suction nozzle, and a size of the second vacuum adsorption device is larger than a size of the first vacuum adsorption device.

8. The glass substrate separation device according to claim 1, further comprising a control unit, controlling the separation wire to enter the opening of the one end of the glass substrate and abuts the lower surface of the glass substrate, and controlling the separation wire to move toward the other end of the glass substrate at a predetermined rate, wherein the separation wire is not in contact with a polyimide layer as a surface layer of the OLED during a whole moving process.

9. The glass substrate separation device according to claim 8, wherein the first position is at an edge of the one end of the glass substrate, and a first vacuum adsorption device is a folding vacuum suction nozzle; the second position is at an intermediate position of the glass substrate, and the second vacuum adsorption device is a folding vacuum suction nozzle, and a size of the second vacuum adsorption device is larger than a size of the first vacuum adsorption device.

10. The glass substrate separation device according to claim 1, wherein the first position is at an edge of the one end of the glass substrate, and a first vacuum adsorption device is a folding vacuum suction nozzle; the second position is at an intermediate position of the glass substrate, and the second vacuum adsorption device is a folding vacuum suction nozzle, and a size of the second vacuum adsorption device is larger than a size of the first vacuum adsorption device.

11. A glass substrate separation method, separating a glass substrate from an organic light emitting diode (OLED), wherein the glass substrate separation method comprises:

providing a lifting off platform for adsorbing and fixing the OLED thereon;

separating the glass substrate from the OLED to form an opening with a plurality of first vacuum adsorption devices adsorbed on a first position of the glass substrate, wherein a diameter of the opening is larger than a diameter of a separation wire;

moving the separation wire from the opening at one end of the glass substrate to the other end of the glass substrate against a lower surface of the glass substrate to separate the glass substrate from the OLED while moving the plurality of first vacuum adsorption devices; and removing the glass substrate from the OLED with a second vacuum adsorption device adsorbed on a second position of the glass substrate.

12. The glass substrate separation method according to claim 11, wherein separating the glass substrate from the OLED to form the opening with the plurality of first vacuum adsorption devices adsorbed on the first position of the glass substrate, wherein the diameter of the opening is larger than the diameter of the separation wire, comprises:

driving the plurality of first vacuum adsorption devices to move in a direction toward the glass substrate to be adsorbed on the first position of the glass substrate;

driving the plurality of first vacuum adsorption devices to move in a direction away from the OLED to separate the glass substrate from the OLED to form the opening inbetween.

13. The glass substrate separation method according to claim 12, wherein the first position is at an edge of the one end of the glass substrate, and the first vacuum adsorption device is a folding vacuum suction nozzle; the second position is at an intermediate position of the glass substrate, and the second vacuum adsorption device is a folding vacuum suction nozzle, and a size of the second vacuum adsorption device is larger than a size of the first vacuum adsorption device.

14. The glass substrate separation method according to claim 11, wherein removing the glass substrate from the OLED with a second vacuum adsorption device adsorbed on a second position of the glass substrate, comprises:

driving the second vacuum adsorption device to move in a direction toward the glass substrate to be adsorbed on the second position of the glass substrate;

driving the second vacuum adsorption device to move in a direction away from the OLED to remove the glass substrate from the OLED.

15. The glass substrate separation method according to claim 14, wherein the first position is at an edge of the one end of the glass substrate, and the first vacuum adsorption device is a folding vacuum suction nozzle; the second position is at an intermediate position of the glass substrate, and the second vacuum adsorption device is a folding vacuum suction nozzle, and a size of the second vacuum adsorption device is larger than a size of the first vacuum adsorption device.

16. The glass substrate separation method according to claim 11, wherein the first position is at an edge of the one end of the glass substrate, and the first vacuum adsorption device is a folding vacuum suction nozzle; the second position is at an intermediate position of the glass substrate, and the second vacuum adsorption device is a folding vacuum suction nozzle, and a size of the second vacuum adsorption device is larger than a size of the first vacuum adsorption device.

* * * * *